(12) United States Patent
Han et al.

(10) Patent No.: US 7,965,521 B2
(45) Date of Patent: Jun. 21, 2011

(54) ELECTROMAGNETIC BANDGAP STRUCTURE AND PRINTED CIRCUIT BOARD

(75) Inventors: Mi-Ja Han, Suwon-si (KR); Han Kim, Yongin-si (KR); Dae-Hyun Park, Ulsan (KR); Jae-Joon Lee, Suwon-si (KR)

(73) Assignee: Samsung Electro-Mechantics Co., Ltd., Suwon (KR)

( * ) Notice: Subject to any disclaimer, the term of this patent is extended or adjusted under 35 U.S.C. 154(b) by 348 days.

(21) Appl. No.: 12/010,558

(22) Filed: Jan. 25, 2008

(65) Prior Publication Data
US 2008/0266026 A1   Oct. 30, 2008

(30) Foreign Application Priority Data

Apr. 30, 2007   (KR) .................. 10-2007-0041989

(51) Int. Cl.
*H05K 9/00*   (2006.01)
(52) U.S. Cl. .............. 361/818; 361/321.2; 361/748; 361/794; 174/255; 174/256; 174/260; 174/262; 257/533; 257/621; 257/664; 257/665; 343/909
(58) Field of Classification Search .......... 361/818, 361/748, 794, 321.2; 174/255, 256, 260, 174/262; 257/533, 621, 664, 665; 343/909
See application file for complete search history.

(56) References Cited

U.S. PATENT DOCUMENTS

| | | | |
|---|---|---|---|
| 6,353,540 B1 * | 3/2002 | Akiba et al. | 361/794 |
| 7,298,234 B2 * | 11/2007 | Dutta | 333/246 |
| 2002/0180004 A1 * | 12/2002 | Oggioni et al. | 257/621 |
| 2005/0029632 A1 * | 2/2005 | McKinzie et al. | 257/665 |

FOREIGN PATENT DOCUMENTS

| | | |
|---|---|---|
| JP | 7-263908 | 10/1995 |
| JP | 2002-171107 | 6/2002 |
| JP | 2003-133801 | 5/2003 |
| JP | 2006-261651 | 9/2008 |

OTHER PUBLICATIONS

Japanese Office Action issued May 18, 2010 in corresponding Japanese Patent Application 2008-043333.
Taiwanese Office Action dated Oct. 21, 2010, issued in corresponding Taiwanese Patent Application No. 097100737.

* cited by examiner

*Primary Examiner* — Xiaoliang Chen

(57) ABSTRACT

An electromagnetic bandgap structure and a printed circuit board that can solve a mixed signal problem between an analog circuit and a digital circuit are disclosed. In accordance with an embodiment of the present invention, the electromagnetic bandgap structure can include a first metal layer; a first dielectric layer, stacked in the first metal layer; a metal plate, stacked in the first dielectric layer; a via, connecting the first metal layer to the metal plate; a second dielectric layer, stacked in the metal plate and the first dielectric layer; and a second metal layer, stacked in the second dielectric layer. Here, a hole can be formed on the metal plate. With the present invention, the electromagnetic bandgap structure can lower a noise level more within the same frequency band as compared with other structures having the same size.

10 Claims, 9 Drawing Sheets

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application No. 10-2007-0041989, filed on Apr. 30, 2007, in the Korean Intellectual Property Office, the disclosure of which is incorporated herein in its entirety by reference.

BACKGROUND OF THE INVENTION

1. Field of the Invention

The present invention relates to a printed circuit board, more specifically to a printed circuit board that can solve a mixed signal problem between an analog circuit and a digital circuit.

2. Background Art

Various apparatuses such as mobile communication terminals, personal digital assistants (PDA), laptop computers and digital multimedia broadcasting (DMB) devices have been launched in order to meet today's trend that mobility is considered as one of the most important issues.

Such apparatuses include a printed circuit board, which is configured to compound analog circuits (e.g. radio frequency (RF) circuits) and digital circuits for wireless communication.

FIG. 1 is a sectional view showing a printed circuit board including an analog circuit and a digital circuit. Although a 4-layered printed circuit board is illustrated, various printed circuit boards such as 2 and 6-layered printed circuit boards can be applied. Here, the analog circuit is assumed to be an RF circuit.

The printed circuit board 100 includes metal layers 110-1, 110-2, 110-3 and 110-4 (hereinafter, collectively referred to as 110), dielectric layers 120-1, 120-2 and 120-3 (hereinafter, collectively referred to as 120) stacked in between the metal layers 110, a digital circuit 130 mounted on the top metal layer 110-1 and an RF circuit 140.

If it is assumed that the metal layer 110-2 is a ground layer and the metal layer 110-3 is a power layer, a current passes through a via 160 connected between the ground layer 110-2 and the power layer 110-3 and the printed circuit board 100 performs a predetermined operation or function.

Here, an operation frequency of the digital circuit 130 and an electromagnetic (EM) wave 150 by harmonics components are transferred to the RF circuit 140, to thereby generate a problem mixed signals. The mixed signal problem is generated due to the EM wave, having a frequency within the frequency band in which the RF circuit 140 is operated, in the digital circuit 130. This problem results in obstructing the accurate operation of the RF circuit 140. For example, when the RF circuit 140 receives a signal ranging a certain frequency band, transferring the EM wave 150 including the signals ranging the certain frequency band from the digital circuit 130 may make it difficult to accurately receive the signal ranging the certain frequency band.

Solving the mixed signal problem becomes more difficult due to the increased complexity of electronic apparatuses and the higher operation frequency of the digital circuit 130.

The decoupling capacitor method, which is a typical solution for power noise, is not adequate for high frequencies. Accordingly, it is necessary to intercept or decrease the noise of the high frequencies between the RF circuit 140 and the digital circuit 130.

FIG. 2 is a sectional view showing an electromagnetic bandgap structure that solves a problem mixed signals between an analog circuit and a digital circuit in accordance with a conventional art, and FIG. 3 is a plan view showing a metal plate configuration of the electromagnetic bandgap structure shown in FIG. 2. FIG. 4 is a perspective view showing the electromagnetic bandgap structure shown in FIG. 2, and FIG. 5 is a schematic view showing an equivalent circuit of the electromagnetic bandgap structure shown in FIG. 2.

The electromagnetic bandgap structure 200 includes a first metal layer 210-1, a second metal layer 210-2, a first dielectric layer 220a a second dielectric layer 220b, a meal plate 232 and a via 234.

The first metal layer 210-1 and the metal plate 232 are connected to each other through the via 234. A mushroom type structure 230 is formed to include the metal plate 232 and the via 234 (refer to FIG. 4).

If the first meal layer 210-1 is a ground layer, the second metal layer 210-2 is a power layer. Also, if the first metal 210-1 is the power layer, the second layer 210-2 is the ground layer.

In other words, the repeated formation of the mushroom type structure 230 (refer to FIG. 3) results in a bandgap structure preventing a signal having a certain frequency band from being penetrated. At this time, the mushroom type structures 230, including the metal plates 232 and the vias 234, are repeatedly formed between the ground layer and the power layer.

The function preventing a signal having a certain frequency band from being penetrated, which is based on resistance $R_E$ and $R_P$, inductance $L_E$ and Lp, capacitance $C_E$, $C_P$ and $C_G$ and conductance $G_P$ and $G_E$, is approximated to the equivalent circuit shown in FIG. 5.

A mobile communication terminal is a good example for an electronic apparatus employing the board realized with the digital circuit and the RF circuit together. In the case of the mobile communication terminal, solving the problem mixed signals needs the noise shielding of an operation frequency band of the RF circuit between 0.8 and 2.0 GHz. The small sized mushroom type structure is also required. However, the foregoing electromagnetic bandgap structure may not satisfy the two conditions needed to solve the problem mixed signals.

It is also required to adjust the blocked noise level in the case of using the electromagnetic bandgap structure in order to solve the mixed signal problem. It is because a designer must not only adjust each bandgap frequency band to meet conditions required for various application products but also lower the noise of the mixed signal to a desired level within a pertinent bandgap frequency band.

SUMMARY OF THE INVENTION

Accordingly, the present invention provides an electromagnetic bandgap structure and a printed circuit board that can lower a noise level more within the same frequency band as compared with other structures having the same size by allowing the noise of a particular frequency not to be penetrated.

The present invention also provides an electromagnetic bandgap structure and a printed circuit board that can solve a problem mixed signals in an electronic apparatus (e.g. a mobile communication terminal) employing the board having the digital circuit and the RF circuit, realized therein together.

An aspect of present invention features an electromagnetic bandgap structure including a first metal layer; a first dielectric layer, stacked in the first metal layer; a metal plate, stacked in the first dielectric layer; a via, connecting the first metal layer to the metal plate; a second dielectric layer, stacked in the metal plate and the first dielectric layer; and a second metal layer, stacked in the second dielectric layer. Here, a hole can be formed on the metal plate.

Here, a plurality of holes can be formed on the metal plate, and the plurality of holes can be symmetrically formed on the metal plate based on the via as a reference axis. The hole can be formed at an area excluding another area to which the via is connected on the metal plate.

There can be a plurality of mushroom type structures including the metal plates, formed with the holes, and the vias between the first metal layer and the second metal layer.

The metal layers of the plurality of mushroom type structures can be placed on a same planar surface.

Another aspect of present invention features a printed circuit board having an analog circuit and a digital circuit. The printed circuit board can include an electromagnetic bandgap structure which is disposed between the analog circuit and the digital circuit, the electromagnetic bandgap structure including a first metal layer; a first dielectric layer, stacked in the first metal layer; a metal plate, stacked in the first dielectric layer; a via, connecting the first metal layer to the metal plate; a second dielectric layer, stacked in the metal plate and the first dielectric layer; and a second metal layer, stacked in the second dielectric layer. Here, a hole can be formed on the metal plate.

Here, the first metal layer can be any one of a ground layer and a power layer, and the second metal layer can be the other.

A plurality of holes can be formed on the metal plate, and the plurality of holes can be symmetrically formed on the metal plate based on the via as a reference axis. The hole can be formed at an area excluding another area to which the via is connected on the metal plate.

There can be a plurality of mushroom type structures including the metal plates, formed with the holes, and the vias between the first metal layer and the second metal layer.

The metal layers of the plurality of mushroom type structures can be placed on a same planar surface.

The analog circuit can be an RF circuit receiving a wireless signal from an outside.

BRIEF DESCRIPTION OF THE DRAWINGS

These and other features, aspects and advantages of the present invention will become better understood with regard to the following description, appended Claims and accompanying drawings where:

DESCRIPTION OF THE EMBODIMENTS

Figure 1:
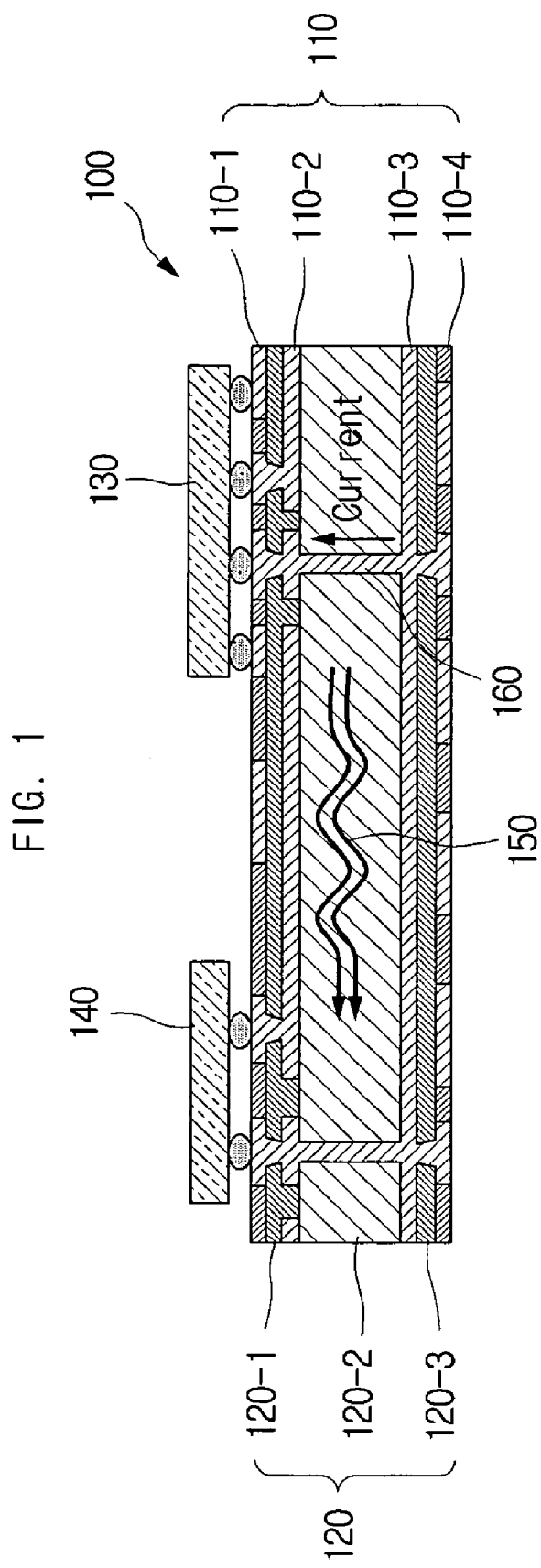
FIG. 1 is a sectional view showing a printed circuit board including analog circuit and a digital circuit.
Figure 2:
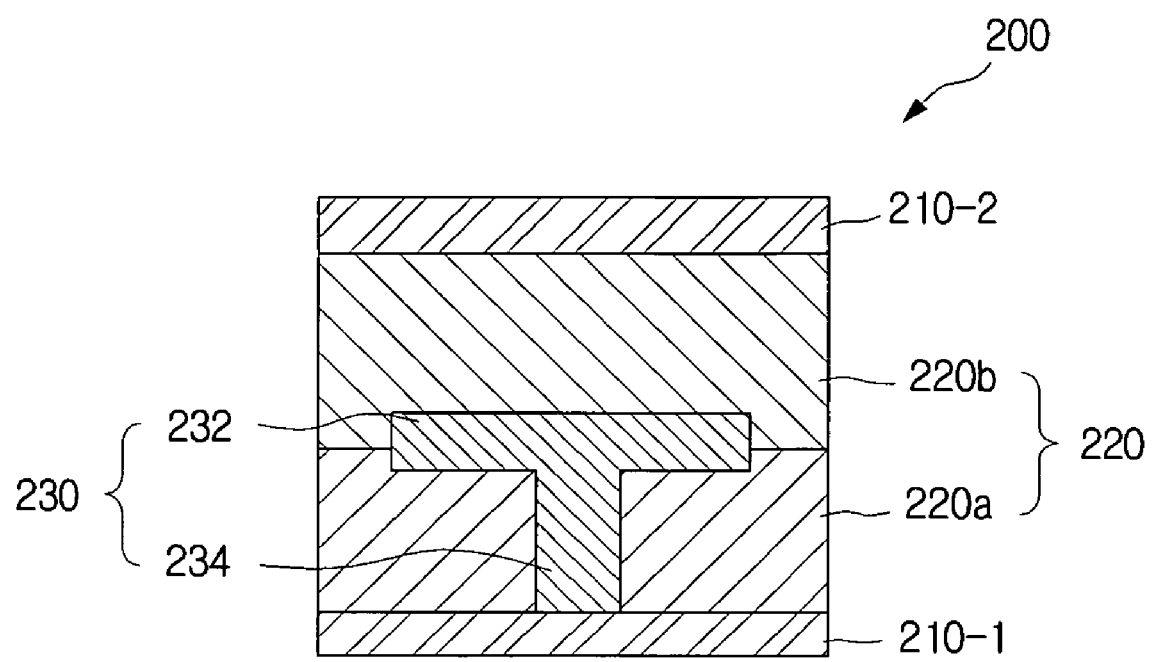
FIG. 2 is a sectional view showing an electromagnetic bandgap structure that solves a problem mixed signals between an analog circuit and a digital circuit in accordance with a conventional art.
Figure 3:
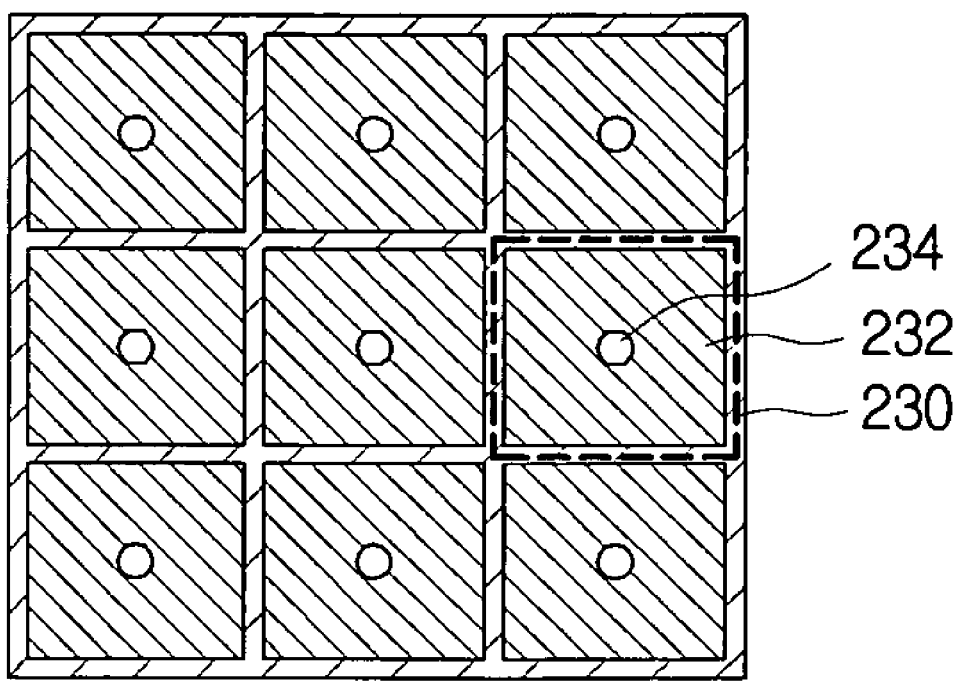
FIG. 3 is a plan view showing a metal plate configuration of the electromagnetic bandgap structure shown in FIG. 2.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings.

Figure 6:
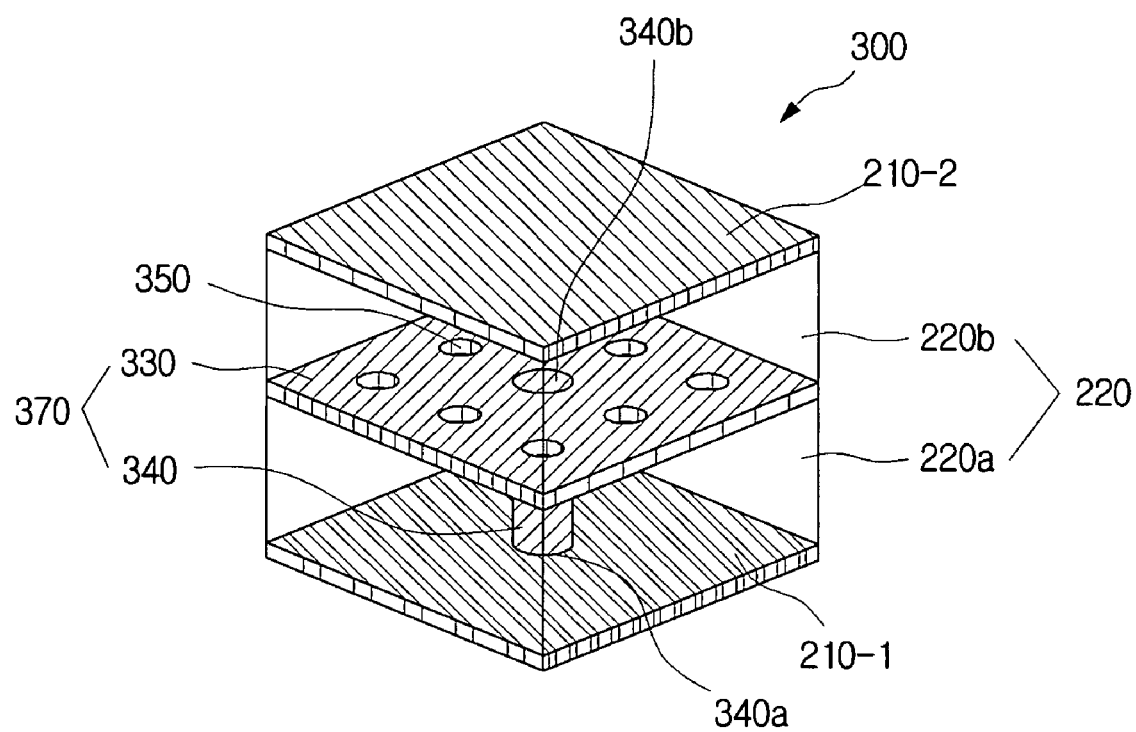
FIG. 6 is a perspective view showing an electromagnetic bandgap structure which solves a mixed signal problem between an analog circuit and a digital circuit.
Figure 7:
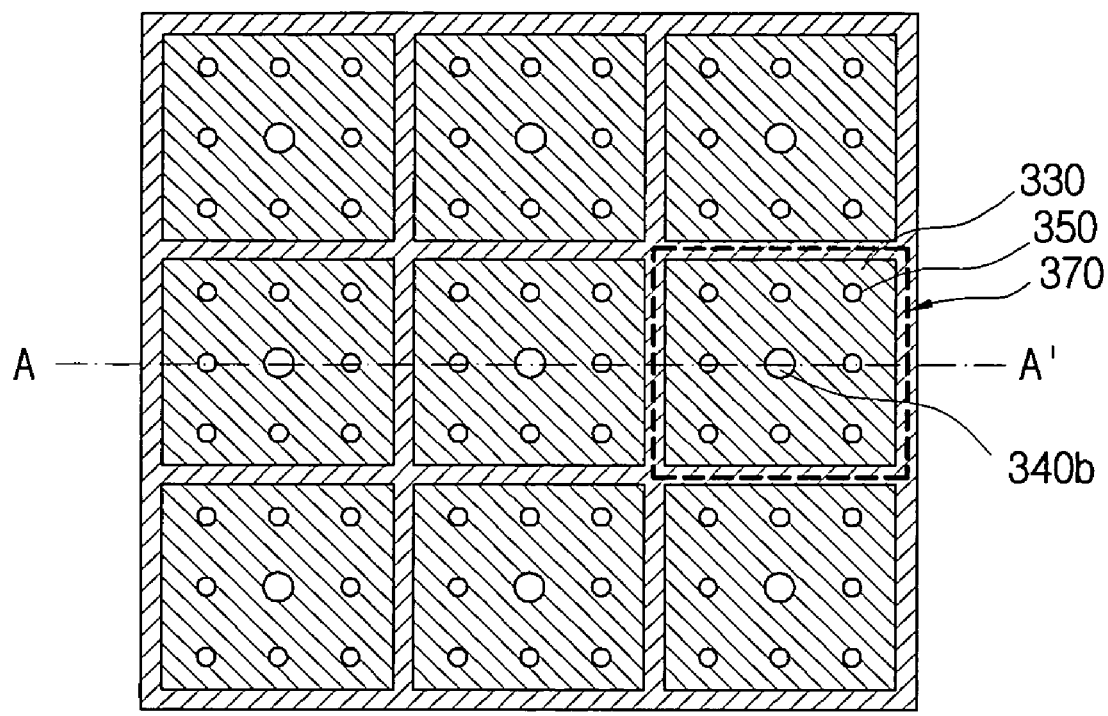
FIG. 7 is a plan view showing a metal plate configuration of the electromagnetic bandgap structure shown in FIG. 6.
Figure 8:
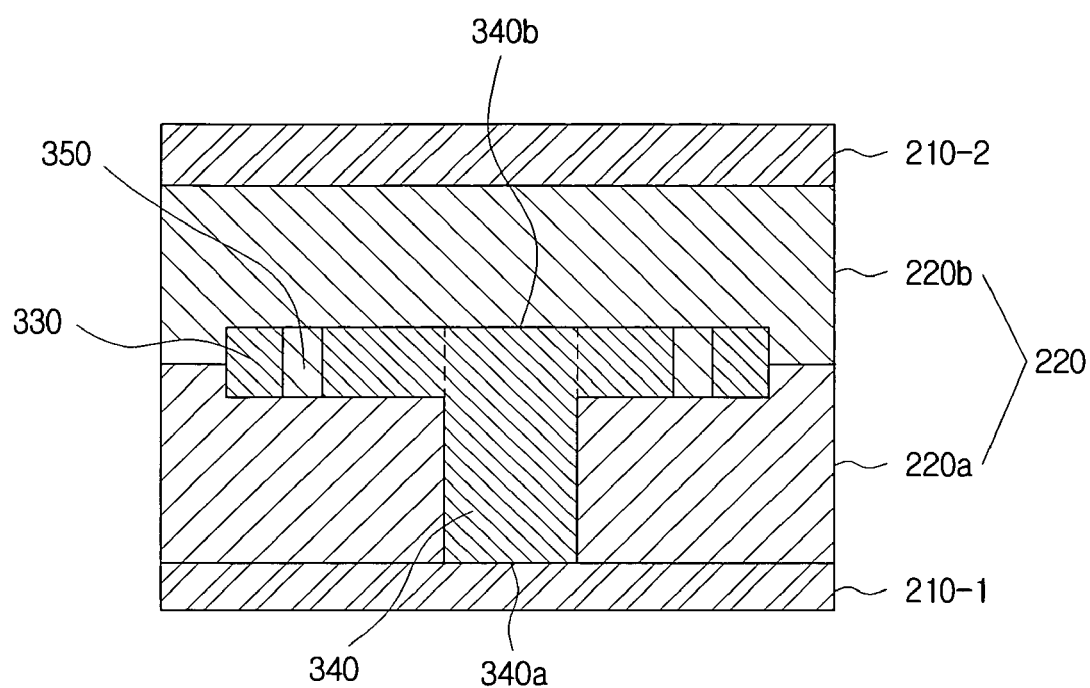
FIG. 8 is a sectional view showing an electromagnetic bandgap structure of the present invention according to the A-A' line of FIG. 7.

FIG. 6 is a perspective view showing an electromagnetic bandgap structure which solves a mixed signal problem between an analog circuit and a digital circuit, and FIG. 7 is a plan view showing a metal plate configuration of the electromagnetic bandgap structure shown in FIG. 6. FIG. 8 is a sectional view showing an electromagnetic bandgap structure of the present invention according to the A-A' line of FIG. 7.

Referring to FIG. 6 through FIG. 8, the electromagnetic bandgap structure 300 in accordance with an embodiment of the present invention can include a first metal layer 210-1, a second metal layer 210-2, a first dielectric layer 220a, a second dielectric layer 220b, a metal plate 330 and a via 340. The metal plate 330 can be formed with a hole 350. In particular, the first dielectric layer 220a can be stacked in the first metal layer 210-1, and the metal plate 330 can be stacked in the first dielectric layer 220a. The first metal layer 210-1 and the metal plate 330 can be connected to each other through the via 340. The second dielectric layer 220b can be stacked in the metal plate 330 and the first dielectric layer 220a, and the second metal layer 210-2 can be stacked in the second dielectric layer 220b. Here, the metal plate 330, formed with the hole 350, and the via 340 can be arranged in a mushroom form between the first metal layer 2210-1 and the second metal layer 210-2 (which is referred to as a mushroom type structure 370). Each of the elements will be described as follows.

The first metal layer 210-1 and the second metal layer 210-2 can be used as means for connecting an electrical power. For example, if the first metal layer 210-1 is a ground layer, the second metal layer 210-2 can be a power layer. If the first metal layer 210-1 is the power layer, the second metal layer 210-2 can be the ground layer. In other words, the first metal layer 210-1 and the second metal layer 210-2 can be each one of the ground layer and the power layer, which are placed close to each other, and the dielectric layer 220 can be placed between the ground layer and the power layer. Accordingly, it is natural that any metal material capable of being provided with the power and transferring an electrical signal can be used without any limitation. The same can be applied to the metal plate 330 and the via 340, which are described below.

Between the first metal layer 210-1 and the second layer 210-2, the dielectric layer 220 can be formed. The dielectric layer 220 can be distinguished into the first dielectric layer 220a and the second dielectric layer 220b according to their formation time. Here, the first dielectric layer 220a and the second dielectric layer 220b can consist of the same dielectric material, but alternatively, each dielectric layer 220a and 220b can consist of materials having different dielectric constants. For example, in the present invention, the second dielectric layer 220b can consist of the material having the higher dielectric constant than the first dielectric layer 220a in order to lower the bandgap frequency more.

Also, the stacked thickness between the first dielectric layer 220a and the second dielectric layer 220b can be suitably adjusted to approach the desired bandgap frequency band (i.e. between 0.8 and 2.0 GHz). Even though the electromagnetic bandgap structures 300 have the same size, the corresponding bandgap frequency band can approach the desired frequency band more closely by largely decreasing the stacked thickness of the second dielectric layer 220b and increasing the stacked thickness of the first dielectric layer 220a as much as the stacked thickness of the second dielectric layer 220b is decreased. Here, the bandgap frequency can refer to the frequency prevented from being transferred among the frequencies transferred from a side to another side.

The hole 350 can be formed on the metal plate 330. Particularly, the hole 350 can be formed at an area excluding the area to which the via 340 (more exactly including the below-described via land) is connected on the metal plate 330. At least one hole 350 can also be formed. In addition, the hole 350 can be formed on the metal plate 330 according to a predetermined pattern (FIG. 6 and FIG. 7).

For example, a plurality of holes 350 can be formed on the metal plate 330. At this time, the plurality of holes 350 can be symmetrically formed based on the via 340, to be connected to the metal plate 330, as a reference axis. The holes 350 can be formed through a hole patterning method according to the process of manufacturing the typical printed circuit board. In other words, the metal plate 330 can be formed with the holes 350 according to the predetermined pattern through a series of processes such as a masking step using a photo resist and an etching step using an etching gas, for example, a PR remover or an etchant.

The via 340 can connect the first metal layer 210-1 to the metal plate 330. below is described the method of forming the via 340 for example.

The first metal layer 210-1, the first dielectric layer 220a and the metal plate 330 can be successively stacked in. A via land (not shown) can be formed at a position in the metal plate 330. Here, the position of the metal plate 330 can be the position in which the via 340 is desired to be formed for the electrical connection to the first metal layer 210-1. The via land, which is to reduce the position error in the drilling process for forming the via 340, can be formed more largely than the sectional area size of the via 340. Then, through the drilling process, the via can be formed to penetrate the via land and the first dielectric layer 220a. Alternatively, the via penetrating the via land, the first dielectric layer 220a and the first metal layer 210-1 can be formed. After the via is formed, the plating process can be performed to allow a plating layer to be formed on the internal wall of the via in order to electrically connect the first metal layer 210-1 to the metal plate 330.

According to the plating process, a plating layer can be formed on the internal wall of the via excluding the center part among the inside part of the via or the entire inside part of the via can be completely filled. In case that the inside part of the via has an empty center part, the empty center part can be filled with the dielectric material or air. Through the foregoing processes, the via 340 can have one end part 340a, connected to the first metal layer 210-1, and the other end part 340b, connected to the metal plate 330.

Although FIG. 6 through FIG. 8 illustrate the mushroom type structure 370 in which one via 340 is connected to one metal plate 330 as an example, a plurality of vias 340 can be connected to one metal plate 330. Also, even though FIG. 6 and FIG. 7 illustrate the metal plate 330 having a regular square shape, the metal plate 330 can have various shapes such as polygons, for example, triangles and hexagons, circles and ellipses. Below are described the mushroom type structure 370 with reference to FIG. 6 through FIG. 8.

At least one mushroom type structure 370 having the metal plate 330, formed with the hole 350, and the via 340 can be arranged between the first metal layer 210-1 and the second metal layer 210-2. At this time, the metal plate 330 of the mushroom type structure 370 can be arranged on the same planar surface or the different planar surface between the first metal layer 210-1 and the second metal layer 210-2. Even if FIG. 6 through FIG. 8 illustrate that the via 340 of the mushroom type structure 370 is connected to the first metal layer 210-1, the via 340 can be connected to the second metal layer 210-2.

Also, a plurality of mushroom type structures 370 can be connected to the first metal layer 210-1 or the second metal layer 210-2 through the via 340. Alternatively, some of the plurality of mushroom type structures can be connected to the first metal layer 210-1 and the others can be connected to the second metal layer 210-2.

FIG. 7 illustrates that the mushroom type structures 370 can be away from each other at predetermined intervals and be repeatedly arranged. The repeated formation of the mushroom type structures 370 can make it possible to block a signal having a frequency band corresponding to an operation frequency band of an analog circuit (e.g. an RF circuit) among an electromagnetic wave proceeding from a digital circuit to the analog circuit. Also, in the mushroom type structure 370 like FIG. 6 and FIG. 7, forming at least one hole 350 at the metal plate 330 can lower a noise level only of a particular frequency band without having a big affect on the capacitance value and frequency band of the entire electromagnetic bandgap structure 300 as compared with the structure in which no hole is formed on the metal plate 330. This will be described more clearly with reference to FIG. 9.

As described above, the electromagnetic bandgap structure 300 of the present invention can be arranged inside the printed circuit board having the analog circuit and the digital circuit. In other words, in accordance with an embodiment of the present invention, the printed circuit board can have the analog circuit and the digital circuit. At this time, the analog circuit can be the RF circuit such as an antenna receiving a wireless signal from an outside.

In the printed circuit board of the present invention, the electromagnetic bandgap structure 300 illustrated in FIG. 6 and FIG. 8 can be arranged between the analog circuit and the digital circuit. For example, the electromagnetic bandgap structure 300 can be arranged between the RF circuit 140 and the digital circuit 130 of the printed circuit board illustrated in FIG. 1. This is to block an electromagnetic wave having a frequency band which is similar to the operation frequency band (e.g. 0.8~2.0 GHz) of the RF circuit 140 among the transferred electromagnetic wave by arranging the electromagnetic bandgap structure 300 to allow the electromagnetic wave generated from the digital circuit 130 to necessarily pass through the electromagnetic bandgap structure 300 before being transferred to the RF circuit 140.

Accordingly, the electromagnetic bandgap structure 300 of the present invention can be arranged in a closed curve shape about the RF circuit 140 or the digital circuit 130. Alternatively, the electromagnetic bandgap structure 300 can be arranged in a signal transferring path between the digital circuit and the analog circuit. It is obvious that the electromagnetic bandgap structure 300 can be arranged in various ways.

As described above, arranging the electromagnetic bandgap structure 300 inside the printed circuit board can make it possible to prevent an electromagnetic wave having a frequency band of the electromagnetic wave transferred from the digital circuit to the analog circuit from being transferred. This can solve the mixed signal problem.

Figure 9:
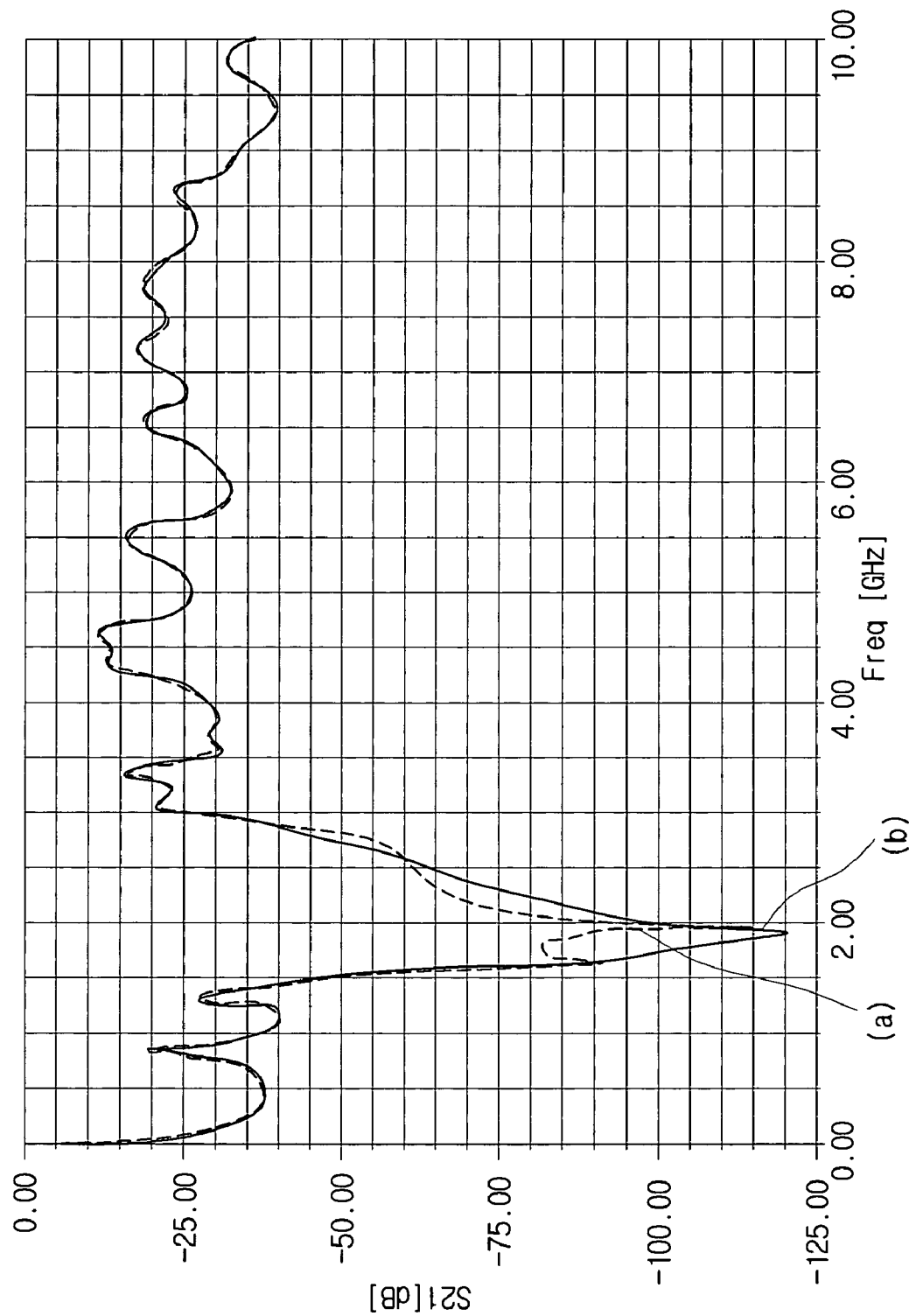
FIG. 9 is graphs showing results that are computer-simulated by using electromagnetic bandgap structures in accordance with a conventional art and an embodiment of the present invention.

FIG. 9 is graphs showing results that are computer-simulated by using electromagnetic bandgap structures in accordance with a conventional art and an embodiment of the present invention Here, FIG. 9 and the below table 1 assume that the conventional electromagnetic bandgap structure 200 and the electromagnetic bandgap structure 300 of the present invention have the same size and the same configuration. Accordingly, even though FIG. 9 and the below table 1 show the case that the bandgap frequency band is between approximately 1.5 and 2.5 GHz, it is natural that adjusting various conditions such as the size of the electromagnetic bandgap structure, and the thickness, dielectric constant and configuration of each element appropriately can design the electromagnetic bandgap structure to have a desired bandgap frequency band or a lower bandgap frequency band when controlling the bandgap frequency band blocked by the electromagnetic bandgap structure 300 of the present invention.

In other words, it must be understood clearly that despite the same design condition, FIG. 9 and the below table 1 are merely examples showing that forming the hole 350 on the metal plate 330 like the electromagnetic bandgap structure 300 of the present invention can improve the blockage ratio of a particular frequency band more as compared with the conventional structure.

FIG. 9 and the below table 1 show computer-simulated results that compare the case of the conventional electromagnetic bandgap structure 200 (refer to (a) of FIG. 9) with the case of the electromagnetic bandgap structure 300 of the present invention (refer to (b) of FIG. 9).

TABLE 1

Figure 4:
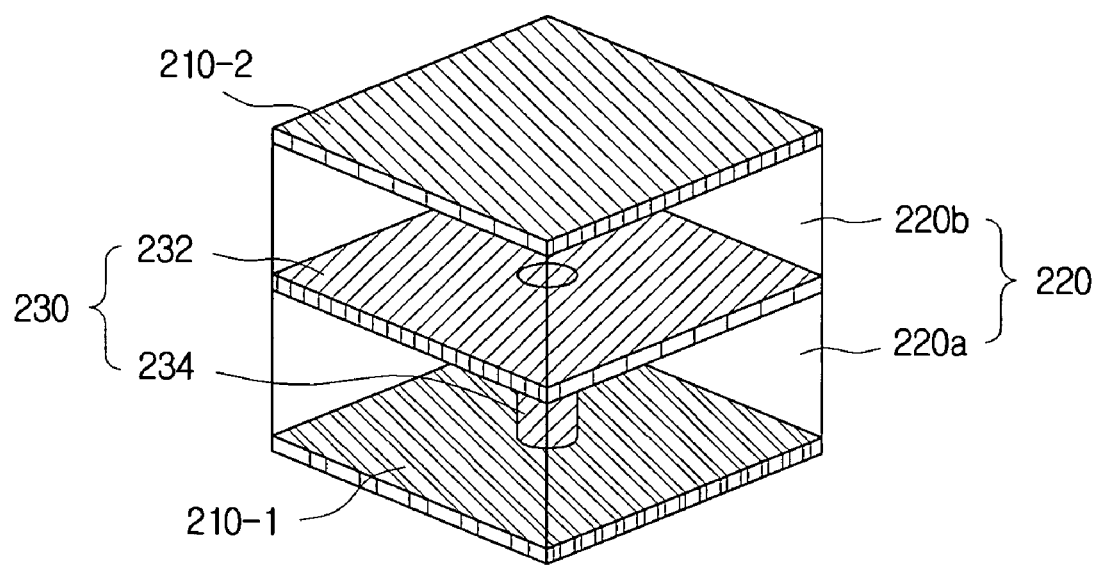
FIG. 4 is a perspective view showing the electromagnetic bandgap structure shown in FIG. 2.
Figure 5:
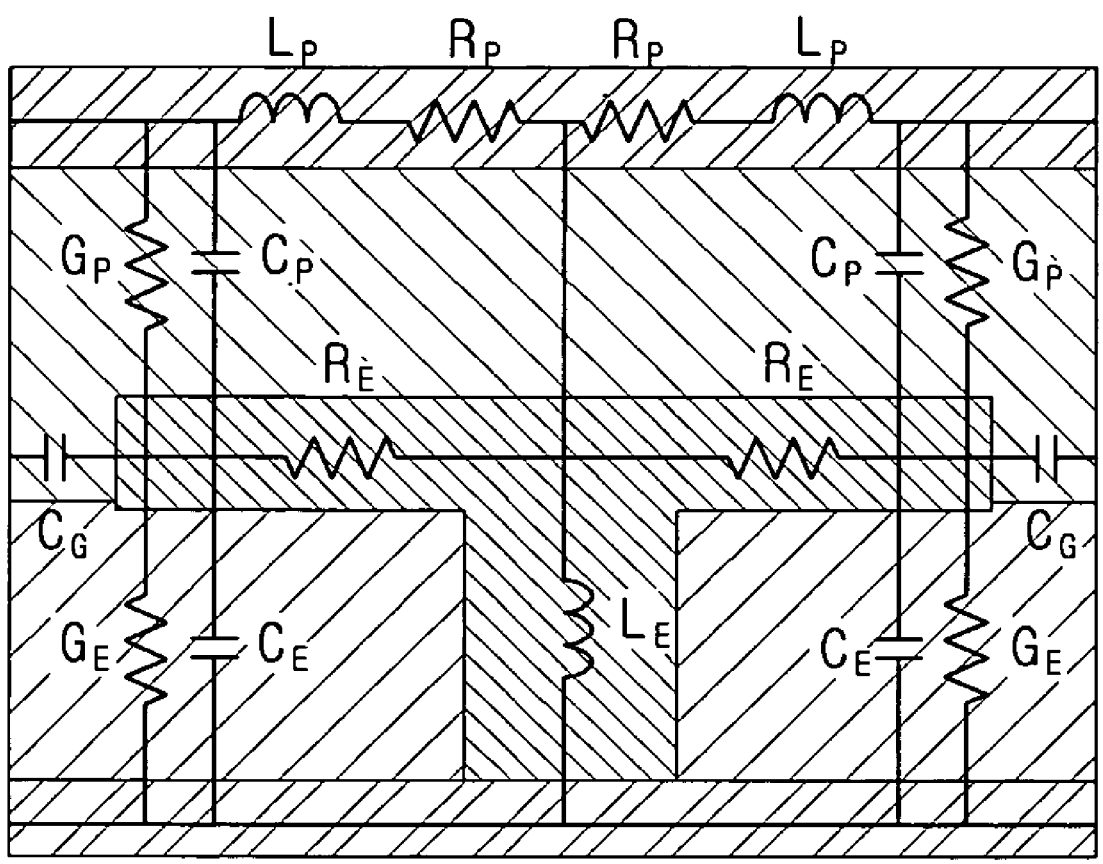
FIG. 5 is a schematic view showing an equivalent circuit of the electromagnetic bandgap structure shown in FIG. 2.

|  | Conventional structure (shown in FIG. 4) | Structure of invention (shown in FIG. 6) |
| --- | --- | --- |
| Bandgap frequency (on a (−)60 dB basis) | 1.56 GHz~2.57 GHz | 1.54 GHz~2.55 GHz |
| Noise level (on a 1.8 GHz basis) | −82.10 dB | −105.94 dB |

In other words, the conventional electromagnetic bandgap structure 200 and the electromagnetic bandgap structure 300 of the present invention show the bandgap frequency band capable of being blocked as 1.56 to 2.57 GHz and 1.54 to 2.55 GHz, respectively, on the (−)60 dB basis. This indicates that the difference between the two bandgap frequency bands is small. However, the noise levels of a particular frequency (in the case of the embodiment of the present invention, the particular frequency is on a basis of 1.8 GHz) show (−)82.10 dB and (−)105.94 dB, respectively. Through this, it can be recognized that the electromagnetic bandgap structure 300 of the present invention lowers the noise level by 20 dB (i.e. 10 times or more) as compared with the conventional electromagnetic bandgap structure 200.

This shows that the case of forming the hole 350 on the metal plate 330 like the electromagnetic bandgap structure has improved the blockage ratio of a particular frequency band more as compared with the case of forming no hole like the conventional electromagnetic bandgap structure 200. The reason that forming the hole 350 has improved the blockage ratio is described as follows.

As described above, an electromagnetic wave corresponding to the bandgap frequency band among the electromagnetic wave transferred from one side (close to the digital circuit) to the other side (close to the analog circuit) can be prevented from being transferred by the electromagnetic bandgap structure 300 of the present invention. At this time, an electromagnetic wave having a particular wavelength (i.e. frequency) band can be more prevented from being transferred by the hole 350 formed on the metal plate 330. This is because the blockage ratio of the electromagnetic wave can be improved at the particular frequency band in the bandgap frequency band.

Here, the frequency band at which the blockage ratio of the electromagnetic wave is improved can depend on the size and diameter of the hole 350 formed on the metal plate 330. This indicates that adjusting the size and diameter of the hole 350 to be formed on the metal plate 300 suitably can make it possible to select or adjust the frequency band at which the blockage ratio of the electromagnetic wave is desired to be improved in order to meet design specifications of the electromagnetic bandgap structure or printed circuit board of the present invention. Also, it shall be obvious that the blockage ratio of the electromagnetic wave can be improved at a particular frequency band by adjusting the quantity or configuration of the holes 350 to be formed on the metal plate 330.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. An electromagnetic bandgap structure, comprising:
a first metal layer;
a first dielectric layer, stacked on the first metal layer;
a metal plate, stacked on the first dielectric layer;
a via, connecting the first metal layer to the metal plate;
a second dielectric layer, stacked on the metal plate and the first dielectric layer; and
a second metal layer, stacked on the second dielectric layer,
wherein a plurality of holes are formed on the metal plate, the holes being formed at an area excluding another area to which the via is connected on the metal plate, and the holes being filled with a non-conductive material.

2. The electromagnetic bandgap structure of claim 1, wherein the plurality of holes are symmetrically formed on the metal plate based on the via as a reference axis.

3. The electromagnetic bandgap structure of claim 1, wherein there are a plurality of mushroom type structures including the metal plates, formed with the holes, and the vias between the first metal layer and the second metal layer.

4. The electromagnetic bandgap structure of claim 3, wherein the metal plates of the plurality of mushroom type structures are placed on a same planar surface.

5. A printed circuit board having an analog circuit and a digital circuit, the printed circuit board in which an electromagnetic bandgap structure is disposed between the analog circuit and the digital circuit, the electromagnetic bandgap structure comprising:
a first metal layer;
a first dielectric layer, stacked on the first metal layer;
a metal plate, stacked on the first dielectric layer;
a via, connecting the first metal layer to the metal plate;
a second dielectric layer, stacked on the metal plate and the first dielectric layer; and
a second metal layer, stacked on the second dielectric layer,
wherein a plurality of holes are formed on the metal plate, the holes being formed at an area excluding another area to which the via is connected on the metal plate, and the holes being filled with a non-conductive material.

6. The printed circuit board of claim 5, wherein the first metal layer is any one of a ground layer and a power layer, and the second metal layer is the other.

7. The printed circuit board of claim 5, wherein the plurality of holes are symmetrically formed on the metal plate based on the via as a reference axis.

8. The printed circuit board of claim 5, wherein there are a plurality of mushroom type structures including the metal plates, formed with the holes, and the vias between the first metal layer and the second metal layer.

9. The printed circuit board of claim 8, wherein the metal layers of the plurality of mushroom type structures are placed on a same planar surface.

10. The printed circuit board of claim 5, wherein the analog circuit is an RF circuit receiving a wireless signal from an outside.

\* \* \* \* \*

UNITED STATES PATENT AND TRADEMARK OFFICE
CERTIFICATE OF CORRECTION

PATENT NO. : 7,965,521 B2  
APPLICATION NO. : 12/010558  
DATED : June 21, 2011  
INVENTOR(S) : Mi-Ja Han et al.

Page 1 of 1

It is certified that error appears in the above-identified patent and that said Letters Patent is hereby corrected as shown below:

On the Title Page, Item (73) (Assignee), Line 1, Delete "Electro-Mechantics" and insert --Electro-Mechanics--, therefor.

Signed and Sealed this  
Twenty-seventh Day of September, 2011

David J. Kappos  
*Director of the United States Patent and Trademark Office*